(12) United States Patent
Takahashi et al.

(10) Patent No.: US 8,907,449 B2
(45) Date of Patent: Dec. 9, 2014

(54) THIN FILM MIM CAPACITORS AND MANUFACTURING METHOD THEREFOR

(75) Inventors: Tomoyuki Takahashi, Takasaki (JP); Kentarou Morito, Takasaki (JP); Yuichi Sasajima, Takasaki (JP); Yoshinari Take, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 170 days.

(21) Appl. No.: 13/121,081

(22) PCT Filed: Oct. 26, 2009

(86) PCT No.: PCT/JP2009/068738
§ 371 (c)(1),
(2), (4) Date: Mar. 25, 2011

(87) PCT Pub. No.: WO2010/050606
PCT Pub. Date: May 6, 2010

(65) Prior Publication Data
US 2011/0193194 A1      Aug. 11, 2011

(30) Foreign Application Priority Data

Oct. 28, 2008 (JP) ................................. 2008-277299

(51) Int. Cl.
| | | |
|---|---|---|
| H01L 29/94 | (2006.01) | |
| H01L 27/01 | (2006.01) | |
| H01G 4/008 | (2006.01) | |
| H01G 4/224 | (2006.01) | |
| H01G 4/33 | (2006.01) | |
| H01L 49/02 | (2006.01) | |

(52) U.S. Cl.
CPC .............. *H01L 27/016* (2013.01); *H01G 4/008* (2013.01); *H01G 4/224* (2013.01); *H01G 4/33* (2013.01); *H01L 28/75* (2013.01)

USPC .................................. 257/532; 257/E29.343

(58) Field of Classification Search
USPC ......................................................... 257/532
See application file for complete search history.

(56) References Cited

U.S. PATENT DOCUMENTS

| | | |
|---|---|---|
| 6,358,811 B1 | 3/2002 | Kim |
| 6,611,014 B1 | 8/2003 | Kanaya |

(Continued)

FOREIGN PATENT DOCUMENTS

| | | |
|---|---|---|
| JP | 2000-150804 A | 5/2000 |
| JP | 2001-085626 A | 3/2001 |

(Continued)

OTHER PUBLICATIONS

Notification of First Office Action issued by the Chinese Patent Office, mailed Apr. 28, 2012, for Chinese counterpart application No. 200980137877.2.

(Continued)

*Primary Examiner* — Matthew W Such
*Assistant Examiner* — Abul Kalam
(74) *Attorney, Agent, or Firm* — Law Office of Katsuhiro Arai (57) ABSTRACT

Proposed are thin film MIM capacitors with which deterioration of insulating properties and leakage current properties can be sufficiently inhibited. Also proposed is a manufacturing method for the thin film MIM capacitors. For the thin film MIM capacitor (1), a lower electrode (3), a base metal thin film (4), the dielectric thin film (5) and the upper electrode (6) are formed to approximately the same area. The lower electrode (3) has a configuration that differs from the other films to form a part for external connection. The side surface of the base metal thin film (4), the dielectric thin film (5), and the upper electrode (6) are covered with a base metal oxide (7) that comprises the same metal atoms as the base metal thin film (4).

9 Claims, 6 Drawing Sheets (56) References Cited

U.S. PATENT DOCUMENTS

| | | | |
|---|---|---|---|
| 6,821,862 B2* | 11/2004 | Cho | 438/396 |
| 2002/0001971 A1 | 1/2002 | Cho | |
| 2004/0185634 A1* | 9/2004 | Lim et al. | 438/396 |
| 2004/0238862 A1* | 12/2004 | Ichimori | 257/295 |
| 2005/0073803 A1 | 4/2005 | Cho | |
| 2007/0077721 A1* | 4/2007 | Kanaya | 438/396 |
| 2008/0087930 A1* | 4/2008 | Lee et al. | 257/300 |
| 2009/0293247 A1* | 12/2009 | Chiang | 29/25.02 |

FOREIGN PATENT DOCUMENTS

| | | |
|---|---|---|
| JP | 2001-111007 A | 4/2001 |
| JP | 2002-093797 A | 3/2002 |
| JP | 2002-164506 A | 6/2002 |
| JP | 2002-280528 A | 9/2002 |
| JP | 2003-115545 A | 4/2003 |
| JP | 2006-190716 A | 7/2006 |
| JP | 2007-243017 A | 9/2007 |

OTHER PUBLICATIONS

Notification of Reasons for Refusal issued by the Japanese Patent Office, mailed Mar. 29, 2013, for Japanese counterpart application No. 2008-277299.

A Notification of Third Office Action with Search Report issued by the State Intellectual Property Office of China, mailed Jul. 10, 2013, for Chinese counterpart application No. 200980137877.2.

* cited by examiner

Background Art

THIN FILM MIM CAPACITORS AND MANUFACTURING METHOD THEREFOR

This application is the U.S. National Phase under 35 U.S.C. §371 of International Application PCT/JP2009/068738, filed Oct. 26, 2009, which claims priority to Japanese Patent Application No. 2008-277299, filed Oct. 28, 2008. The International Application was published under PCT Article 21(2) in a language other than English.

TECHNICAL FIELD

The present invention relates to a thin film MIM (metal-insulator-metal) capacitor and method for manufacturing the same.

BACKGROUND ART

Figure 18:
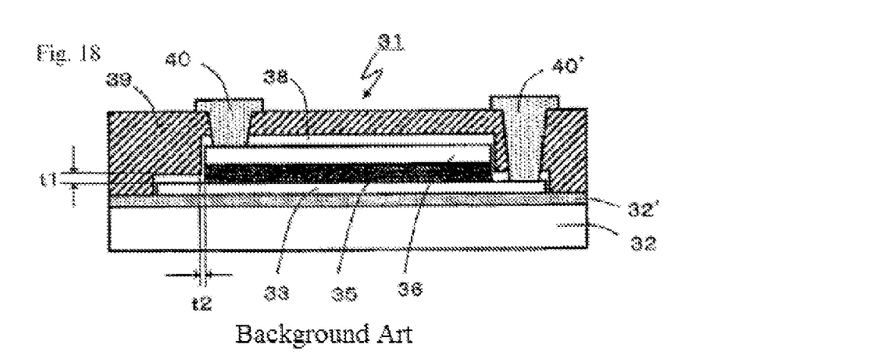
FIG. 18 is a schematic section view showing a comparative thin film MIM capacitor (discussed in the section of Background Art for the purpose of providing a context for the present invention).

Electronic devices have become increasingly smaller in recent years, and accordingly capacitors and other circuit components used in electronic devices are also becoming smaller and smaller. One group of electronic components that can meet such demand for size reduction are thin film electronic components, representative of which are thin film MIM capacitors. A thin film MIM capacitor like the one 31 shown in FIG. 18 is obtained by forming a lower electrode 33, a dielectric thin film 35 and an upper electrode 36 on an insulating substrate 32 by means of the sputtering method, evaporation method, CVD method, sol-gel method or other thin film forming process. This capacitor is called "thin film MIM capacitor" because the obtained capacitor has a structure constituted by metal (lower electrode), insulating material (dielectric thin film) and metal (upper electrode). The thin film MIM capacitor 31 having this structure provides a high capacitance because a dielectric layer of 1 µm or less in thickness can be formed with ease.

The thin film MIM capacitor 31 can be processed in any desired shape via etching or other method by using photo lithography technology. The upper electrode 36 and lower electrode 33 are exposed on the side faces of the capacitor part of the processed thin film MIM capacitor. Thus, the upper electrode 36 and lower electrode 33 are shorted easily. This is why the thin film MIM capacitor 31 is normally coated entirely with an insulating material 39.

This insulating material 39 is also formed by any thin film forming process, just like the thin film MIM capacitor 31. From the thin film MIM capacitor that has been coated with the insulating material 39, capacitance is taken out through lead conductors 40, 40' that pass through the aforementioned insulating material 39 and connect to the upper electrode 36 and lower electrode 33, respectively. These lead conductors 40, 40' are formed by electroplating or other method.

However, one problem has been that the insulating properties and leakage current properties of the thin film MIM capacitor 31 might deteriorate due to hydrogen that generates during the formation of this insulating material 39 and lead conductors 40, 40'. This is why the thin film MIM capacitor 31 is coated with an insulating hydrogen barrier layer 38. This insulating hydrogen barrier layer 38 is constituted by a thin film made of $Al_2O_3$, $TiO_2$, $Ta_2O_5$, SiN, etc.

Patent Literature 1: Japanese Patent Laid-open No. 2006-190716

SUMMARY OF THE INVENTION

Problems to be Solved by the Invention

The insulating hydrogen barrier layer 38 is formed using the sputtering method, etc. However, the thickness t2 of the insulating hydrogen barrier layer formed on side faces of the capacitor part of the thin film MIM capacitor tends to become thinner than the thickness t1 of the insulating hydrogen barrier layer formed in other parts. For this reason, sometimes sufficient hydrogen barrier performance cannot be achieved, which can result in deterioration of insulating properties and leakage current properties not prevented effectively.

The present invention proposes a thin film MIM capacitor that can solve the aforementioned problem and thereby prevent deterioration of insulating properties and leakage current properties, and also proposes a method for manufacturing such thin film MIM capacitor.

Means for Solving the Problems

As a first means for solving the problem, the present invention proposes a thin film MIM capacitor having a substrate, a lower electrode formed on the substrate, a dielectric layer thin film formed on the lower electrode, and an upper electrode formed on the dielectric thin film; wherein a base metal thin film or base metal oxide thin film is formed between the aforementioned lower electrode and dielectric thin film and the side faces of the aforementioned dielectric thin film and upper electrode are coated with an insulating oxide that contains metal atoms identical to the metal constituting the aforementioned base metal thin film or base metal oxide thin film.

The thin film MIM capacitor proposed by the aforementioned first means for solving the problem has its side faces coated with the base metal oxide which is an insulating material, and this, combined with the effect of the insulating hydrogen barrier layer formed on top, ensures a sufficient thickness of the insulating material. As a result, deterioration of insulating properties and leakage current properties can be prevented effectively.

In addition, the base metal oxide on the side faces of the thin film MIM capacitor contains metal atoms identical to the metal constituting the base metal thin film or base metal oxide thin film that in turns constitutes the thin film MIM capacitor. As a result, adhesion between the base metal oxide on the side faces of the thin film MIM capacitor, and the side faces of the thin film MIM capacitor is improved.

Furthermore, as a second means for solving the problem the present invention proposes, in addition to the aforementioned first means for solving the problem, a thin film MIM capacitor wherein the metal constituting the aforementioned base metal thin film or base metal oxide thin film is Al, Ti or Ta. $Al_2O_3$, $TiO_2$ and $Ta_2O_5$ have good hydrogen barrier properties. According to the aforementioned second means for solving the problem, the base metal oxide on the side faces of the thin film MIM capacitor is $Al_2O_3$, $TiO_2$ or $Ta_2O_5$, which makes the insulating hydrogen barrier layer on the side faces of the thin film MIM capacitor thicker. This further adds to the effectiveness of preventing deterioration of insulating properties and leakage current properties.

It should be noted that the lower electrode in the aforementioned first means for solving the problem can be formed using the base metal thin film. In this case, the base metal oxide on the side faces of the thin film MIM capacitor contains the same metal constituting the lower electrode, which results in better adhesion between the base metal oxide on the side faces of the thin film MIM capacitor, and the side faces of the thin film MIM capacitor.

As a third means for solving the problem, the present invention also proposes a method for manufacturing a thin film MIM capacitor proposed by the aforementioned first means for solving the problem, wherein such method for manufacturing a thin film MIM capacitor comprises: a step to sequentially form, on a substrate, a metal film constituting a lower electrode, base metal thin film, dielectric thin film and metal film constituting an upper electrode; a step to process via dry etching the aforementioned base metal thin film, dielectric thin film and metal film constituting the upper electrode all at once and also to cause re-deposition of etching products from the aforementioned base metal thin film on the side faces of the aforementioned base metal thin film, dielectric thin film and upper electrode; and a step to oxidize the aforementioned etching products only, or both the aforementioned etching products and base metal thin film.

According to the aforementioned third means for solving the problem, the base metal oxide with which to coat the side faces of the thin film MIM capacitor can be formed simultaneously during dry etching. Accordingly, no additional process needs to be provided to form an insulating material on the side faces of the thin film MIM capacitor and insulating properties and leakage current properties on the side face of the thin film MIM capacitor can be improved with an easy method.

Effects of the Invention

According to the present invention, a thin film MIM capacitor that effectively prevents deterioration of insulating properties and leakage current properties can be obtained.

BEST MODE FOR CARRYING OUT THE INVENTION

Figure 1:
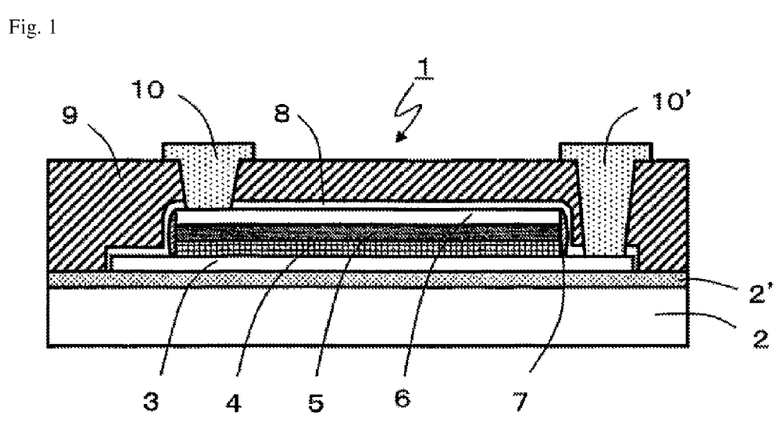
FIG. 1 is a schematic section view showing a first embodiment of thin film MIM capacitor conforming to the present invention.

A first embodiment pertaining to a thin film MIM capacitor conforming to the present invention is explained using a drawing. FIG. 1 is a schematic section view showing a first embodiment of thin film MIM capacitor conforming to the present invention.

A thin film MIM capacitor 1 is constituted by a lower electrode 3, a base metal thin film 4, a dielectric thin film 5 and an upper electrode 6 deposited in layers sequentially on a substrate 2. The base metal thin film 4, dielectric thin film 5 and upper electrode 6 are formed roughly to the same area size, while the lower electrode 3 has a shape different from other thin films in order to form connection parts with the outside. The side faces of the base metal thin film 4, dielectric thin film 5 and upper electrode 6 are covered with a base metal oxide 7. The lower electrode 3, base metal thin film 4, dielectric thin film 5, upper electrode 6 and base metal oxide 7 are coated with an insulating hydrogen barrier layer 8, and then covered further with an insulating material 9.

The upper electrode 6 connects to the outside via a lead conductor 10, while the lower electrode 3 connects to the outside via a lead conductor 10'. If the substrate 2 is a Si substrate, a $SiO_2$ layer 2' is formed between the substrate 2 and lower electrode 3 to ensure insulating properties.

For the substrate 2, the aforementioned Si substrate or other insulating substrate such as alumina substrate can be used favorably. If a Si substrate is used, a $SiO_2$ layer 2' is formed as mentioned above, but this is not particularly necessary in the case of an alumina substrate or other insulating substrate. Take note that the following explanations assume that the thin film MIM capacitor 1 is a single, discrete component and therefore the size of the substrate 2 represents that for one component. Practically, the substrate 2 is prepared in the form of collective substrates that consist of multiple discrete components manufactured at once in a manner allowing for cutting and dividing later on, or as part of a multi-layer substrate or substrate for semiconductor apparatus.

For the lower electrode 3 and upper electrode 6, Pt, Pd, Au or other noble metal, or $RuO_2$, $IrO_2$ or other conductive oxide, can be used favorably. The lower electrode 3 and upper electrode 6 may use the same substance or each may be made of a different substance. The lower electrode 3 is etched separately from the upper electrode 6 to form a connection part with the outside.

By utilizing this design, the metal thin film constituting the lower electrode 3 can be used as an etching stop layer when the base metal thin film 4, dielectric thin film 5 and upper electrode 6 are etched together.

For the base metal thin film 4, any base metal that exhibits insulating properties after oxidation can be used, but Al, Ti and Ta can be used favorably. Here, the base metal thin film 4 functions as part of the lower electrode. The base metal thin film 4 contains metal atoms identical to the base metal oxide 7 coating the side faces of the base metal thin film 4, dielectric thin film 5 and upper electrode 6, and therefore achieves good adhesion with the base metal oxide 7. As a result, the base metal thin film 4 can cause the base metal oxide 7 to adhere strongly to the side faces of the base metal thin film 4, dielectric thin film 5 and upper electrode 6.

The dielectric thin film 5 is constituted by a dielectric material such as barium titanate ($BaTiO_3$; hereinafter abbreviated as "BT"), strontium titanate ($SrTiO_3$; hereinafter abbreviated as "ST"), barium strontium titanate ($BaSrTiO_3$; hereinafter abbreviated as "BST"), or the like. Among these, BST can be used favorably. The thinner the dielectric thin film 5, the greater the capacitance of the thin film MIM capacitor 1 becomes. The dielectric thin film 5 is formed to a thickness in the order of nm, not exceeding 1 μm.

As mentioned above, the base metal oxide 7 coats the side faces of the base metal thin film 4, dielectric thin film 5 and upper electrode 6. This base metal oxide 7 is the reason why insulating properties of the thin film MIM capacitor 1 can be ensured. The base metal oxide 7 contains metal atoms identical to the base metal thin film 4. Accordingly, it adheres strongly to the base metal thin film 4 and also adheres strongly to the side faces of the dielectric thin film 5 and upper electrode 6. If the metal atoms constituting the base metal oxide 7 are Al, Ti or Ta, the oxide also functions as an insulating hydrogen barrier layer. This leads to a thicker insulating hydrogen barrier layer formed on the side faces of the base metal thin film 4, dielectric thin film 5 and upper electrode 6.

The insulating hydrogen barrier layer 8 has the role of preventing hydrogen that generates in the post processes to form the insulating material 9 and lead conductors, or hydrogen that generates during or after mounting of the thin film MIM capacitor 1 onto an electronic circuit, from entering the lower electrode 3, dielectric thin film 5 and upper electrode 6. The insulating hydrogen barrier layer 8 is formed by $Al_2O_3$, $TiO_2$, $Ta_2O_5$, SiN or other material.

The insulating layer 9 is formed, if necessary, in a manner covering the insulating hydrogen barrier layer 8. Favorable materials for the insulating layer 9 include $Al_2O_3$ and $SiO_2$, among others. Also, the lead conductor 10 passes through a via hole and connects to the upper electrode 6, while the lead conductor 10' passes through a via hole and connects to the lower electrode 3. For the lead conductors 10, 10', Cu having relatively high conductivity can be used favorably.

Next, the manufacturing process of the thin film MIM capacitor is explained. It should be noted, however, that the manufacturing conditions, etc., are not at all limited to those stated in the explanations below, but can be changed in various ways within the scope of the present invention.

Figure 2:
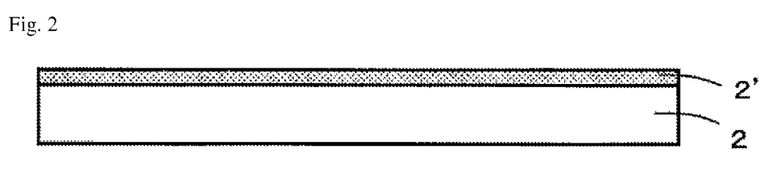
FIG. 2 is a schematic section view showing a manufacturing process of the thin film MIM capacitor conforming to the present invention.

First, a substrate 2 is prepared as shown in FIG. 2. Here, the substrate 2 is a Si substrate. Formed on the substrate 2 is a $SiO_2$ layer 2'. This $SiO_2$ layer 2' is formed to achieve good insulating properties because the insulating properties of the Si substrate are relatively low. To provide this substrate 2, a Si substrate on which a $SiO_2$ layer 2' has been formed beforehand is used, or the surface of a Si substrate is oxidized to form a $SiO_2$ layer 2'.

Figure 3:
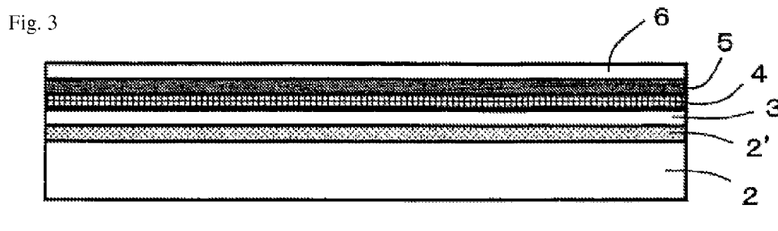
FIG. 3 is a schematic section view showing a manufacturing process of the thin film MIM capacitor conforming to the present invention.

Next, a metal thin film constituting a lower electrode 3, base metal thin film 4, dielectric thin film 5 and metal thin film constituting an upper electrode 6 are sequentially formed over the entire surface of the $SiO_2$ layer 2' on the substrate 2, as shown in FIG. 3. For the forming method, any existing thin film forming process can be used, such as the sputtering method, evaporation method, CVD method or sol-gel method.

Figure 4:
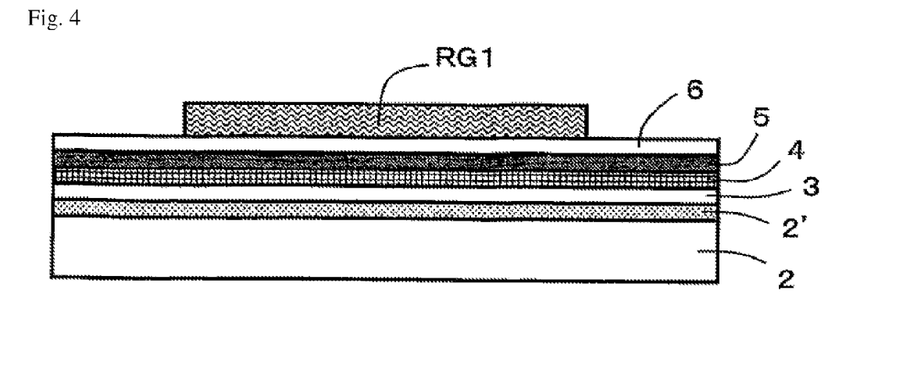
FIG. 4 is a schematic section view showing a manufacturing process of the thin film MIM capacitor conforming to the present invention.

Next, patterning is performed using photo-resist, as shown in FIG. 4. For this photo-resist, either the positive type where exposed parts are dissolved and removed, or negative type where exposed parts remain as patterns, may be used. Photo-resist is coated over the entire surface of the metal thin film constituting the upper electrode 6, which is then exposed and developed. This is followed by heat treatment at 100° C. to form a patterned photo-resist film RG1. Next, the substrate on which this photo-resist film RG1 has been formed is put in the chamber of dry etching equipment. Normally the temperature in the chamber is set to 200° C. or above to prevent re-deposition on the side faces of the thin film MIM capacitor of etching products, or namely thin film particles that have been removed by etching. However, this is not required under the present invention and therefore the temperature in the chamber can be set to normal temperature.

Figure 5:
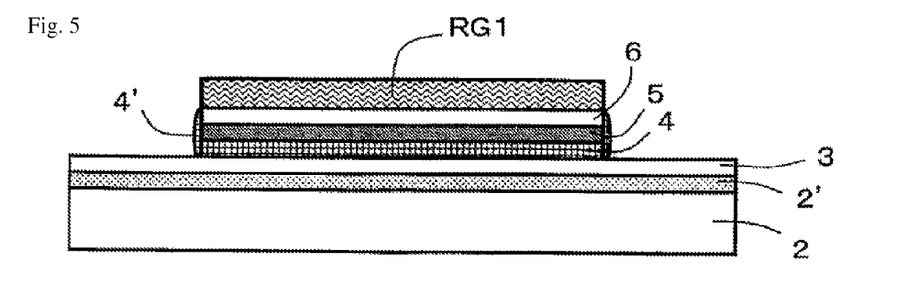
FIG. 5 is a schematic section view showing a manufacturing process of the thin film MIM capacitor conforming to the present invention.

Next, dry etching is performed to achieve the condition shown in FIG. 5. For the dry etching method, the reactive ion etching method (hereinafter abbreviated as "RIE") can be used favorably. RIE is used to etch the metal thin film constituting the upper electrode 6, dielectric thin film 5 and base metal thin film 4 in one lot. At this time, etching products 4' deposit onto the side faces formed by etching. These etching products 4' are removed particles of the base metal thin film 4 that are depositing again. With a normal thin film MIM capacitor, the side faces are inclined to prevent etching products from depositing again. However, the present invention is characterized by intentionally causing re-deposition of these etching products and therefore the side faces need not be inclined. It should be noted that RIE is implemented by ICP (inductively coupled plasma) type equipment.

Figure 6:
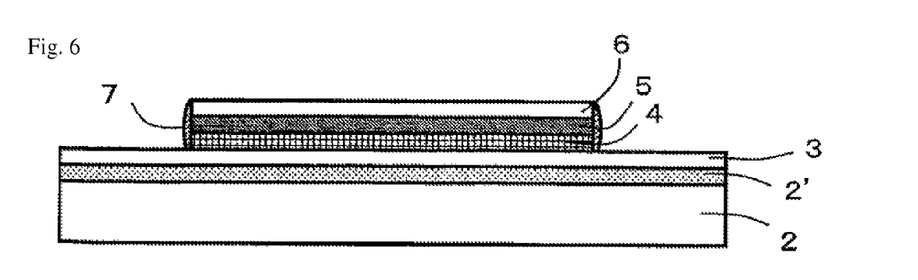
FIG. 6 is a schematic section view showing a manufacturing process of the thin film MIM capacitor conforming to the present invention.

Next, the photo-resist film RG1 is removed and etching products '4 are oxidized to form a base metal oxide 7, as shown in FIG. 6. The photo-resist film RG1 can be removed using a chemical solution, or by ashing involving exposure to oxygen plasma. Oxygen plasma ashing allows for simultaneous oxidation of etching products 4'. Oxygen plasma ashing is performed in a barrel-type ashing apparatus at conditions of, for example, oxygen of 100 sccm, bias power of 240 W and pressure of 100 Pa. If the photo-resist film RG1 is removed using a chemical solution, annealing is performed to oxidize etching products 4'. Annealing is performed, for example, in atmosphere or oxygen ambience at conditions of 600° C. for 30 minutes.

Figure 7:
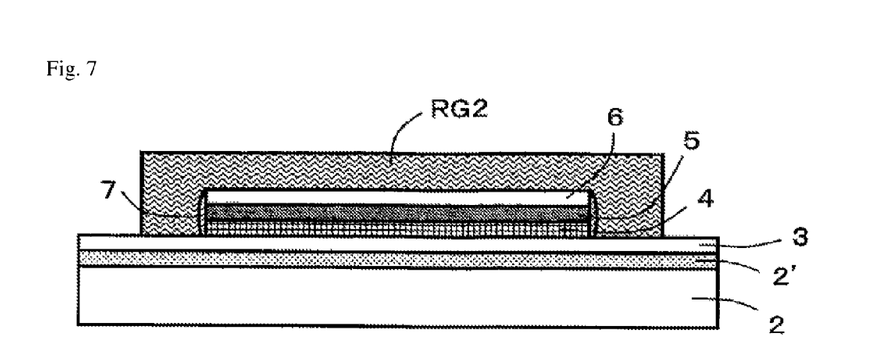
FIG. 7 is a schematic section view showing a manufacturing process of the thin film MIM capacitor conforming to the present invention.

Next, the base metal thin film 4, dielectric thin film 5, upper electrode 6 and base metal oxide 7 are coated with a photo-resist film RG2 and the lower electrode 3 is patterned, as shown in FIG. 7.

Figure 8:
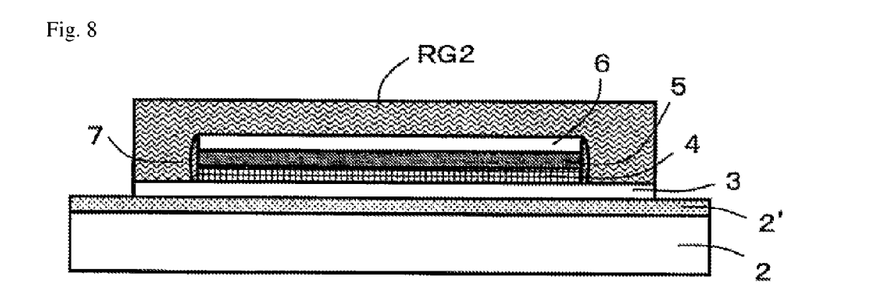
FIG. 8 is a schematic section view showing a manufacturing process of the thin film MIM capacitor conforming to the present invention.
Figure 9:
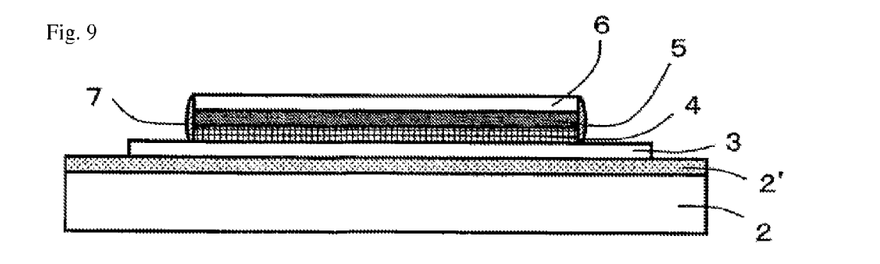
FIG. 9 is a schematic section view showing a manufacturing process of the thin film MIM capacitor conforming to the present invention.

The same explanation given in connection with the photo-resist film RG1 applies to the patterning method. Next, RIE is performed and, as shown in FIG. 8, parts of the metal thin film constituting the lower electrode 3 which are not coated with the photo-resist film RG2 are removed. Then, the photo-resist film RG2 is removed and the lower electrode 3 is formed, as shown in FIG. 9. The same explanation given in connection with the photo-resist film RG1 applies to the method to remove the photo-resist film RG2.

Take note that oxidation of etching products 4' can be performed after the photo-resist film RG2 has been removed or concurrently while the photo-resist film RG2 is removed. To be specific, the resist photo-resist film RG1 is removed with a chemical solution, after which the photo-resist film RG2 is formed without oxidizing etching products 4' and the lower electrode 3 is patterned. Next, etching products 4' are oxidized after the photo-resist film RG2 has been removed or concurrently while the photo-resist film RG2 is removed, to form the base metal oxide 7.

Figure 10:
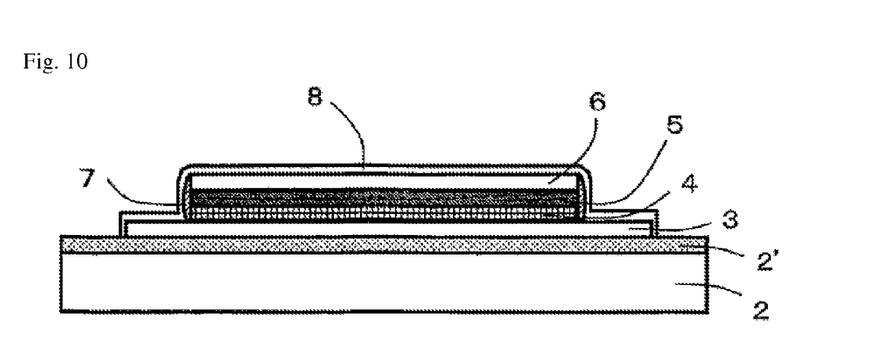
FIG. 10 is a schematic section view showing a manufacturing process of the thin film MIM capacitor conforming to the present invention.

Subsequently, an insulating hydrogen barrier layer 8 is formed, as shown in FIG. 10.

The insulating hydrogen barrier layer 8 can be formed using any existing thin film forming process. Here, the thickness of the insulating hydrogen barrier layer 8 formed on the side faces of the base metal thin film 4, dielectric thin film 5 and upper electrode 6 is kept smaller than the thickness of the insulating hydrogen barrier layer 8 in other parts. Despite the reduced thickness, a drop in insulating properties can be prevented due to existence of the base metal oxide 7. If the base metal oxide 7 is an oxide of Al, Ti or Ta, a drop in hydrogen barrier performance can also be prevented.

Figure 11:
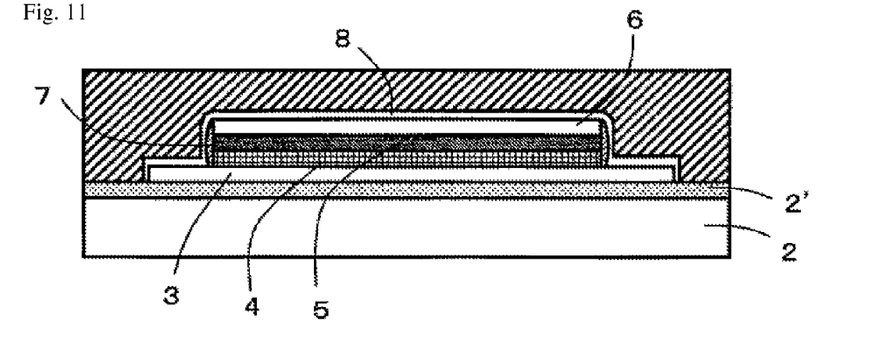
FIG. 11 is a schematic section view showing a manufacturing process of the thin film MIM capacitor conforming to the present invention.

Next, an insulating material 9 is formed to entirely cover the capacitor, as shown in FIG. 11.

Figure 12:
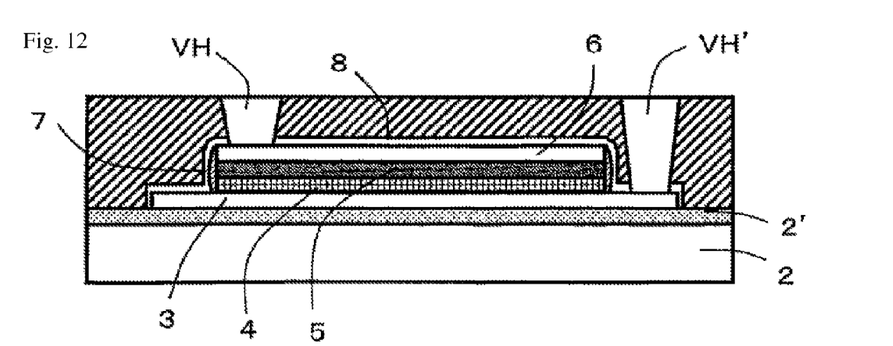
FIG. 12 is a schematic section view showing a manufacturing process of the thin film MIM capacitor conforming to the present invention.

The insulating material 9 can be formed using any existing thin film forming process. Then, a via hole VH reaching the upper electrode 6 and a via hole VH' reaching the lower electrode 3 are formed, as shown in FIG. 12. The via holes VH, VH' can be formed by means of dry etching. Next, a Cu film is formed by electroless Cu plating over the entire surface of the insulating material 9 including the via holes VH, VH', to form a seed layer (not illustrated). This is followed by electrolytic Cu plating to precipitate Cu on the seed layer. Then, chemical mechanical polishing (CMP) or other method is used to remove excess Cu other than Cu filled in the via holes VH, VH', to form lead conductors 10, 10'. This way, the thin film MIM capacitor 1 shown in FIG. 1 is obtained.

Figure 13:
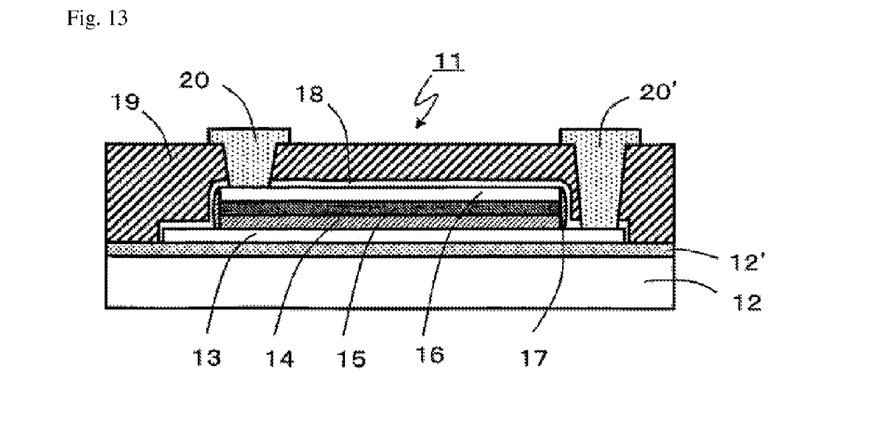
FIG. 13 is a schematic section view showing an example of variation of the first embodiment of thin film MIM capacitor conforming to the present invention.

One example of variation of the first embodiment of thin film MIM capacitor conforming to the present invention is a thin film MIM capacitor 11 shown in FIG. 13. This capacitor is different from the thin film MIM capacitor 1 shown in FIG. 1 in that a base metal oxide thin film 14 is formed instead of the base metal thin film 4. This base metal oxide thin film 14 is formed, for example, by oxidizing the base metal thin film 4 of the thin film MIM capacitor shown in FIG. 1 concurrently while etching products 4' are oxidized, or by forming a base metal oxide thin film in the initial thin film forming process. If the base metal oxide thin film is formed in the initial thin film forming process, oxidation is no longer needed when a base metal oxide 17 is formed.

Figure 14:
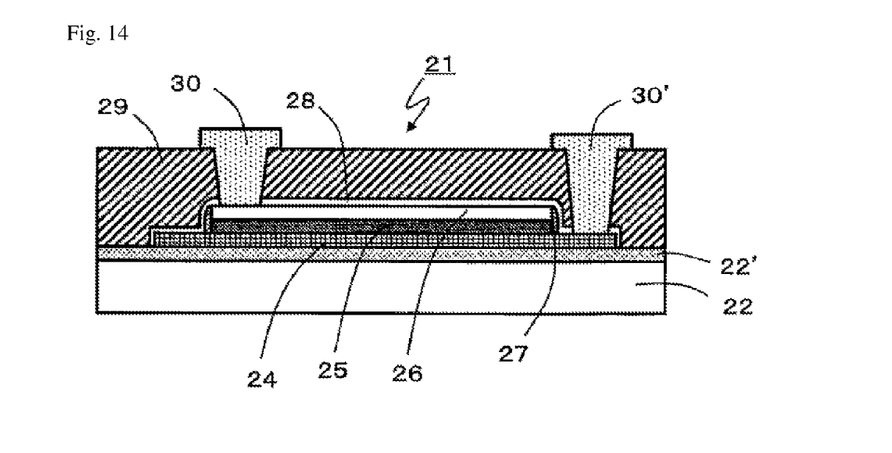
FIG. 14 is a schematic section view showing a second embodiment of thin film MIM capacitor conforming to the present invention.

Next, a second embodiment of thin film MIM capacitor conforming to the present invention is explained. A thin film MIM capacitor 21 shown in FIG. 14 is different from the thin film MIM capacitor 1 shown in FIG. 1 in that a lower electrode 24 is formed by a base metal thin film.

Figure 15:
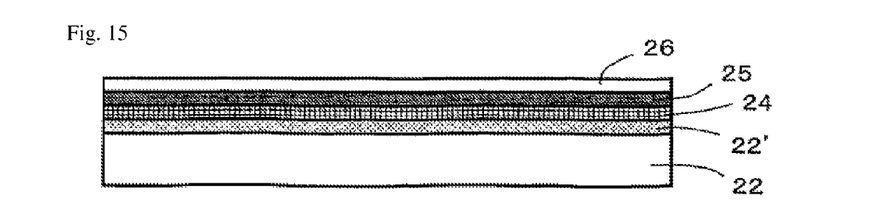
FIG. 15 is a schematic section view showing a manufacturing process of the second embodiment of thin film MIM capacitor conforming to the present invention.

This thin film MIM capacitor 21 is obtained as follows. First, among the manufacturing processes according to the first embodiment, the processes from forming the lower electrode to forming the upper electrode is modified as shown in FIG. 15 and implemented. In other words, a base metal thin film constituting a lower electrode 24, a dielectric thin film 25 and a metal thin film constituting an upper electrode 26 are sequentially formed on a substrate 22 according to an existing thin film process.

Figure 16:
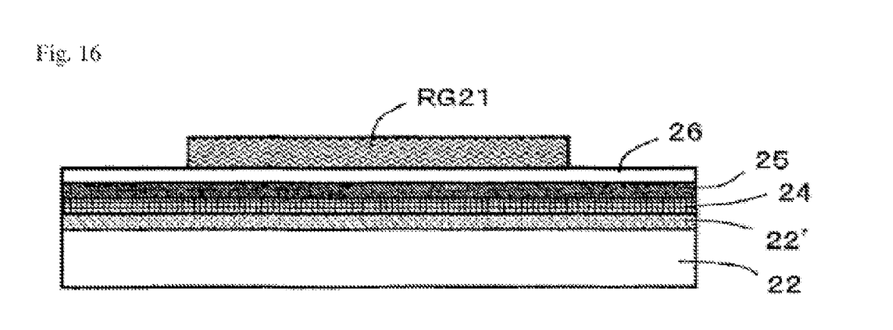
FIG. 16 is a schematic section view showing a manufacturing process of the second embodiment of thin film MIM capacitor conforming to the present invention.
Figure 17:
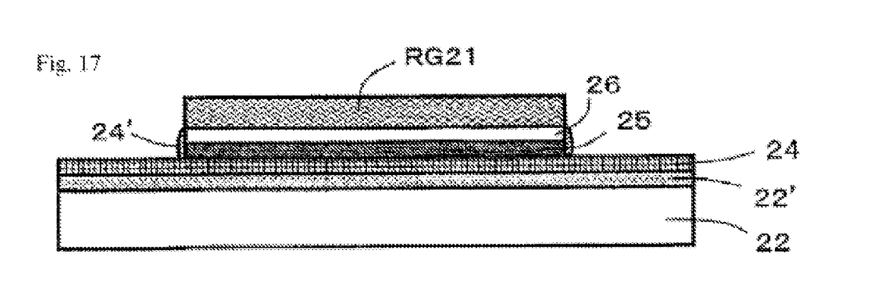
FIG. 17 is a schematic section view showing a manufacturing process of the second embodiment of thin film MIM capacitor conforming to the present invention.

Next, a photo-resist film RG21 is formed and patterning is performed, as shown in FIG. 16. The same explanation given under the first embodiment applies to the patterning method. Next, RIE is used to etch the metal thin film constituting the upper electrode 26 and dielectric thin film 25 as well as parts of the base metal thin film constituting the lower electrode 24 in one lot, as shown in FIG. 17. At this time, etching products 24' generated by removed parts of the base metal thin film constituting the lower electrode 24 deposit again to the side faces of the dielectric thin film 25 and upper electrode 26. These etching products 24' are oxidized to form a base metal oxide 27.

The foregoing has explained embodiments of the present invention. It should be noted, however, that the present invention is not at all limited to the aforementioned embodiments and various modifications are possible within the scope of the present invention.

DESCRIPTION OF THE SYMBOLS

1, 11, 21, 31 Thin film MIM capacitor
2, 12, 22, 32 Substrate
2a, 12a, 22a, 32a $SiO_2$ layer
3, 13, 33 Lower electrode
4 Base metal thin film
4' Etching products
5, 15, 25, 35 Dielectric thin film
6, 16, 26, 36 Upper electrode
7, 17, 27 Base metal oxide
8, 18, 28, 38 Insulating hydrogen barrier layer
9, 19, 29, 39 Insulating material
10, 10', 20, 20', 30, 30', 40, 40' Lead conductor
14 Base metal oxide thin film
24 Lower electrode (base metal thin film)

The invention claimed is:

1. A thin film MIM (metal-insulator-metal) capacitor comprising:
   a substrate;
   a lower electrode formed on the substrate;
   a base metal layer consisting of a base metal which constitutes an upper part of the lower electrode or which constitutes a discrete layer formed on the lower electrode;
   a dielectric thin film formed on the base metal-containing layer;
   an upper electrode formed on the dielectric thin film, said upper electrode, said dielectric thin film, and said base metal-containing layer being etched together using a common photo-resist, constituting etched side faces of the upper electrode, the dielectric thin film, and the base metal layer of the upper electrode, the dielectric thin film, and the base metal-containing layer;
   an insulating oxide side layer covering and continuously extending solely along the etched side faces and ending on an upper surface of the lower electrode, said insulating oxide layer containing metal atoms derived from the base metal-containing layer; and
   an insulating hydrogen barrier layer covering exposed surfaces of the lower electrode and the insulating oxide side layer.

2. A thin film MIM capacitor according to claim 1, wherein the base metal is selected from the group consisting of Al, Ti, and Ta.

3. A thin film MIM capacitor according to claim 1, wherein the dielectric thin film is constituted by a material selected from the group consisting of $BaTiO_3$, $SrTiO_3$, and $BaSrTiO_3$.

4. A thin film MIM capacitor according to claim 1, wherein the insulating hydrogen barrier layer is constituted by a material selected from the group consisting of $Al_2O_3$, $TiO_2$, $Ta_2O_5$, and SiN.

5. A thin film MIM capacitor according to claim 1, wherein the etched side faces are formed in a direction perpendicular to the substrate.

6. A thin film MIM capacitor according to claim 1, wherein the base metal layer function as an upper part of the lower electrode.

7. A thin film MIM capacitor according to claim 1, wherein the base metal layer constitutes a discrete layer formed on the lower electrode.

8. A thin film MIM capacitor according to claim 1, wherein the substrate is constituted by a Si substrate and a $SiO_2$ layer formed thereon or by an alumina substrate.

9. A thin film MIM capacitor according to claim 1, wherein the exposed surface of the lower electrode covered by the insulating hydrogen barrier layer is a surface of the lower electrode exposed when the etched side faces are formed by the etching using the common photo-resist.

* * * * *

UNITED STATES PATENT AND TRADEMARK OFFICE
CERTIFICATE OF CORRECTION

PATENT NO.          : 8,907,449 B2
APPLICATION NO.     : 13/121081
DATED               : December 9, 2014
INVENTOR(S)         : Tomoyuki Takahashi et al.

It is certified that error appears in the above-identified patent and that said Letters Patent is hereby corrected as shown below:

In The Claims

At column 8, line 48, in Claim 1, between "faces" and "and", please insert --of the upper electrode, the dielectric thin film, and the base metal layer--.

Signed and Sealed this
Fourteenth Day of April, 2015

Michelle K. Lee
*Director of the United States Patent and Trademark Office*